(12) United States Patent
Shinomiya et al.

(10) Patent No.: US 8,093,931 B2
(45) Date of Patent: Jan. 10, 2012

(54) SEMICONDUCTOR INTEGRATED CIRCUIT DEVICE

(75) Inventors: Toshio Shinomiya, Ome (JP); Akio Koyama, Kokubunji (JP); Yuji Yokoyama, Ome (JP)

(73) Assignee: Hitachi, Ltd., Tokyo (JP)

( * ) Notice: Subject to any disclaimer, the term of this patent is extended or adjusted under 35 U.S.C. 154(b) by 116 days.

(21) Appl. No.: 12/420,253

(22) Filed: Apr. 8, 2009

(65) Prior Publication Data

US 2009/0256599 A1    Oct. 15, 2009

(30) Foreign Application Priority Data

Apr. 9, 2008    (JP) .................................. 2008-100946

(51) Int. Cl.
*H03L 7/00* (2006.01)
(52) U.S. Cl. ...................................................... 327/143
(58) Field of Classification Search .................... 327/142
See application file for complete search history.

(56) References Cited

U.S. PATENT DOCUMENTS

| 5,515,134 A | 5/1996 | Taguchi |
| 5,936,443 A | 8/1999 | Yasuda et al. |
| 6,144,237 A * | 11/2000 | Ikezaki .......................... 327/143 |

FOREIGN PATENT DOCUMENTS

| JP | 7-159846 A | 6/1995 |
| JP | 9-153777 A | 6/1997 |

* cited by examiner

*Primary Examiner* — Lincoln Donovan
*Assistant Examiner* — Daniel Rojas
(74) *Attorney, Agent, or Firm* — Mattingly & Malur, PC

(57) ABSTRACT

In a semiconductor integrated circuit device generating internal power from external power, an abnormal operation may occur due to an indefinite state of a control signal when the external power is applied and the internal power rises. The semiconductor integrated circuit includes an internal power generating circuit, a control circuit receiving internal power and supplying a first control signal, and a power-on reset circuit generating a reset signal at rising of the internal power. When internal power rises, the reset signal masks an indefinite state of the first control signal supplied from the control circuit.

6 Claims, 12 Drawing Sheets

SEMICONDUCTOR INTEGRATED CIRCUIT DEVICE

CLAIM OF PRIORITY

The present application claims priority from Japanese patent application JP2008-100946 filed on Apr. 9, 2008, the content of which is hereby incorporated by reference into this application.

BACKGROUND OF THE INVENTION

1. Field of the Invention

The present invention relates to a semiconductor integrated circuit device including an internal power generating circuit and a circuit operating on an internal voltage generated in the internal power generating circuit on the basis of an applied external voltage.

2. Description of the Related Art

Japanese Patent Laid-Open No. H9 (1997)-153777 discloses a power-on reset signal generating circuit POR operated on a voltage IntVdd, which an internal voltage generating circuit 4 generates. If a power-on reset signal generated by the power-on reset signal generating circuit POR is input to an internal circuit 3, the internal circuit 3 is reset. Therefore, it is possible to stop the operation of the circuit in an abnormal state when power is applied.

Japanese Patent Laid-Open No. H7 (1995)-159846 relates to a power supply system of a camera and discloses a mechanism which resets a logic circuit 4. Power VCC generated by a DC/DC converter 2 is supplied to the logic circuit 4. The logic circuit 4 receives a reset clear signal generated by a logic reset circuit 3 and starts an operation. In the mechanism of Japanese Patent Laid-Open No. 7 (1995)-159846, the DC/DC converter 2 is controlled by a CPU 5 which is already operating (that is, which does not generate an indefinite value).

BRIEF SUMMARY OF THE INVENTION

In Japanese Patent laid-Open No. 9 (1997)-153777 and Japanese Patent Laid-Open No. 7 (1995)-159846, an operation of an internal power generating circuit (the internal voltage generating circuit 4 in Japanese Patent Laid-Open No. 9 (1997)-153777 and the DC/DC converter 2 in Japanese Patent Laid-Open No. 7 (1995)-159846) is controlled by a control signal or external power. For example, in Japanese Patent Laid-Open No. H9 (1997)-153777, an external voltage ExVdd is applied and a power response thereto becomes an initiating signal to operate the internal voltage generating circuit 4. Moreover, in Japanese Patent Laid-Open No. H9 (1997)-159846, power is supplied from a battery 1 and a control signal CNT1 is input from the CPU 5 so as to operate the DC/DC converter 2. However, the internal power generating circuit may be controlled by an internal circuit of a semiconductor integrated circuit. An example thereof is shown in FIG. 12.

An internal power generating circuit 121 is connected to a first power supply terminal VCC and a second power supply terminal GND. External power VB is applied between the first power supply terminal VCC and the second power supply terminal GND, such that the internal power generating circuit 121 generates internal power VDD. The internal power VDD is supplied to a power-on reset circuit 122 (hereinafter, referred to as a POR circuit), which is an internal circuit of a semiconductor integrated circuit device, or a control circuit 123, such as a CPU. The POR circuit 122 generates a reset signal RST in response to rising of the internal power VDD.

When the internal power VDD rises, a latch circuit, or the like (not shown), which are constituents elements of the control circuit 123, become indefinite values. For this reason, a circuit operation of the control circuit 123 stops at the rising. The control circuit 123 is initialized and a circuit operation starts by receiving a reset signal RST, such that, the control circuit 123 normally operates.

Here, the internal power generating circuit 121 is configured to receive a control signal D1 from the control circuit 123. For example, the control signal D1 is a control signal for turning off the internal power generating circuit 121 provided in order to perform an IDDQ leak test. As shown in FIG. 12, in the semiconductor integrated circuit in which an internal circuit is configured to operate on the internal power VDD generated by the internal power generating circuit 121, the internal power generating circuit 121 is turned off, such that the internal power VDD is not generated. Therefore, an IDDQ leak test of the internal circuit cannot be performed. For this reason, in an IDDQ leak test mode, in a state in which internal power is fixed on the basis of external power, the internal circuit of the semiconductor integrated circuit device including the internal power generating circuit 121 is turned off and a leak test is performed.

FIG. 13 shows an example of a circuit operation of the circuit shown in FIG. 12. A waveform WA illustrates the waveform of the external power VB applied between the first power supply terminal VCC and the second power supply terminal GND, waveforms WB illustrate the waveforms of the control signal D1, waveforms WC illustrate the waveforms of the internal power VDD, and waveforms WD illustrate the waveforms of the reset signal RST. A waveform 131 of the waveforms WC is an expected waveform of the internal power VDD. A period Pa is a period in which there may be indefinite logic in the internal circuit at the rising of the internal power VDD, and a period Pb is a logic reset period (in which the reset signal RST is maintained at a low level) by the reset signal RST defined in the specification of the semiconductor integrated circuit.

The external power VB is supplied between the first power supply terminal VCC and the second power supply terminal GND (the waveform WA). The internal power generating circuit 121 receives the external power VB, generates the internal power VDD (the waveforms WC), and starts power supply to the POR circuit 122 which is an internal circuit or the control circuit 123. When the internal power VDD rises, a latch circuit, such as a flip-flop constituting the control circuit 123, takes an indefinite value. Therefore, the POR circuit 122 generates the reset signal RST outputting a low level during a predetermined period (the period Pb), on the basis of a response of the internal power VDD, and the control circuit 123 is initialized by the reset signal RST. Here, due to enlargement of the scale of the control circuit 123 or heavy usage of latch circuits according to an improvement of function of a system, a reset signal delay or a reset propagation delay easily occurs. In order to compensate the reset delay or defective resetting, there is a measure in which a transistor size of the latch circuit is adjusted to make it easy to take a reset value at rising of power. However, the measure is not exact. An output signal of the control circuit 123 including the latch circuit or the like may become an indefinite value at the rising of the power.

Since the control signal D1 is a signal which controls the internal power generating circuit 121 to be turned off at a high level, an expected value of the control signal D1 at the rising of the internal power VDD is the low level. However, when the control signal becomes indefinite so as to temporarily take the high level (a waveform 132 of the waveforms WB), the internal power generating circuit 121 becomes a turn-off state to cause a decrease in the internal power VDD as shown in a waveform 133 of the waveforms WC. If this functions as a trigger such that the temporary high level of the control signal D1 continues, a feedback operation to decrease the internal power VDD again occurs. As a result, the internal power may convert to a voltage value Vddx different from an expected internal power voltage Vdd (a waveform 134 of the waveforms WC). In this case, a voltage value of the reset signal RST also converts to the voltage value Vddx (a waveform 135 of the waveforms WD).

Moreover, even though the control signal D1 exceeds the temporary high level such that the internal power VDD converts to the expected value Vdd, a kink response of the internal power VDD generated during that procedure may change the pulse width of the reset signal RST (a waveform 136 of the waveforms WD in which the reset signal RST is transitioned to a high level at a timing earlier than the specification), and may cause an error in the resetting of the control circuit 123.

In a semiconductor integrated circuit including an internal power generating circuit having such a defective potential, in order for an IDDQ leak test, it is possible to avoid the above-mentioned problem by setting a function of an external test terminal, instead of the control signal D1. However, in consideration of cost due to the addition of the test terminal, it is preferable to control the function in an internal circuit by using an existing external interface provided in a control circuit such as a CPU.

One representative example of the invention is as follows. A semiconductor integrated circuit device includes an internal power generating circuit receiving external power, a control circuit receiving internal power from the internal power generating circuit and supplying a first control signal for controlling the internal power generating circuit, and a power-on reset circuit receiving the internal power and generating a first reset signal at rising of the internal power. In the semiconductor integrated circuit device, when the internal power rises, the first reset signal masks an indefinite state of the first control signal supplied from the control circuit.

In the internal circuit using the internal power voltage which the internal power generating circuit generates on the basis of the external power, even though the control circuit such as a micro-processor has a circuit constitution to perform feedback control on the internal power generating circuit, it is possible to prevent an abnormal operation due to an indefinite state of the control signal generated when the external power is applied and to make a normal operation possible.

DETAILED DESCRIPTION OF THE INVENTION

Hereinafter, an embodiment of the present invention will be described with reference to the accompanying drawings. Circuit elements constituting individual blocks of the embodiment are composed of known insulated gate type field effect transistors (referred to as MOS transistors), but are not limited thereto.

First Embodiment

Figure 1:
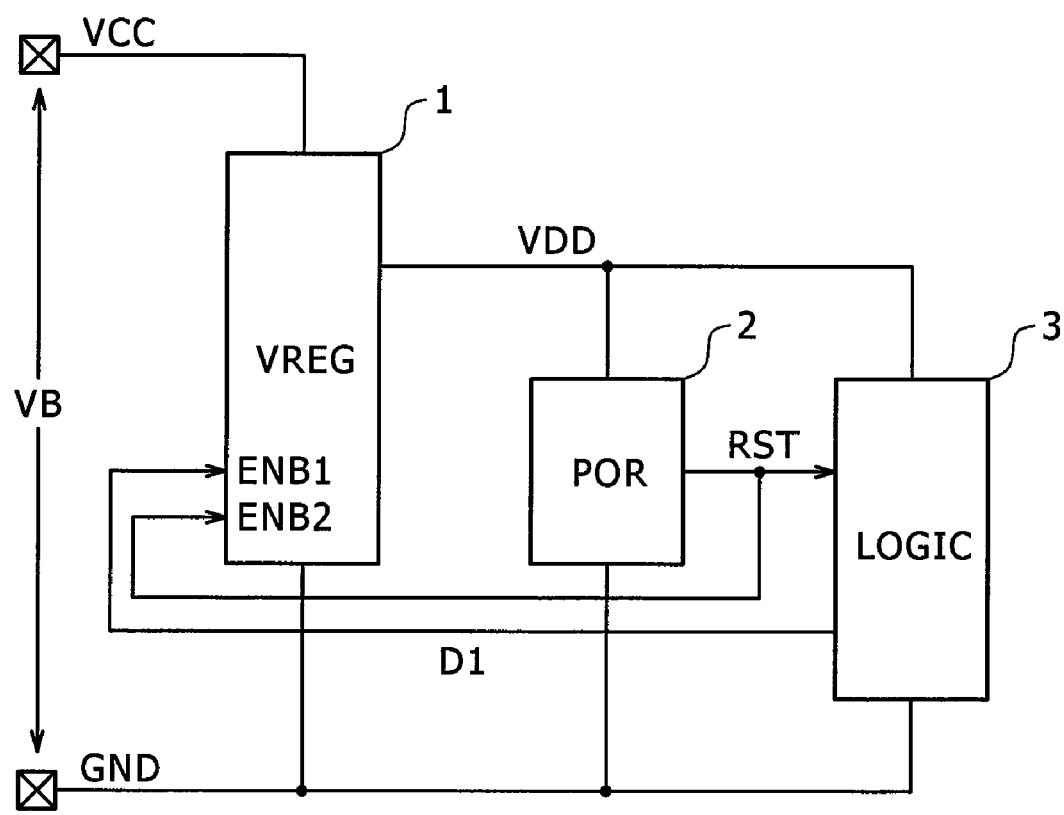
FIG. 1 illustrates a first embodiment of the present invention.

FIG. 1 illustrates a semiconductor integrated circuit according to a first embodiment. An internal power generating circuit 1 is connected to a first power supply terminal VCC and a second power supply terminal GND. An external power VB is applied between the first power supply terminal VCC and the second power supply terminal GND, such that the internal power generating circuit 1 generates an internal power VDD. The internal power VDD is supplied to a POR circuit 2, which is an internal circuit of the semiconductor integrated circuit device, a control circuit 3 such as a CPU or the like. The POR circuit 2 generates a reset signal RST in response to rising of the internal power VDD. When the internal power VDD rises, a latch circuit or the like (not shown) which are constituent elements of the control circuit 3 become indefinite values. Therefore, a circuit operation of the control circuit 3 stops at the rising. The control circuit 3 is initialized and a circuit operation starts by receiving the reset signal RST, such that the control circuit 3 normally operates.

If either one of a control terminal ENB1 and a control terminal ENB2 has a low level while the external power VB is applied, the internal power generating circuit 1 generates the internal power VDD. A control signal D1 from the control circuit 3 to control a turn-on or a turn-off of the internal power generating circuit 1 is input to the control terminal ENB1, and the reset signal RST is input to the control terminal ENB2. The reset signal RST input to the control terminal ENB2 of the internal power generating circuit 1 certainly outputs a low level during a predetermined period so as to mask an indefinite state of the control signal D1 that can be generated when the internal power VDD rises and to stably operate the internal power generating circuit 1.

Figure 2:
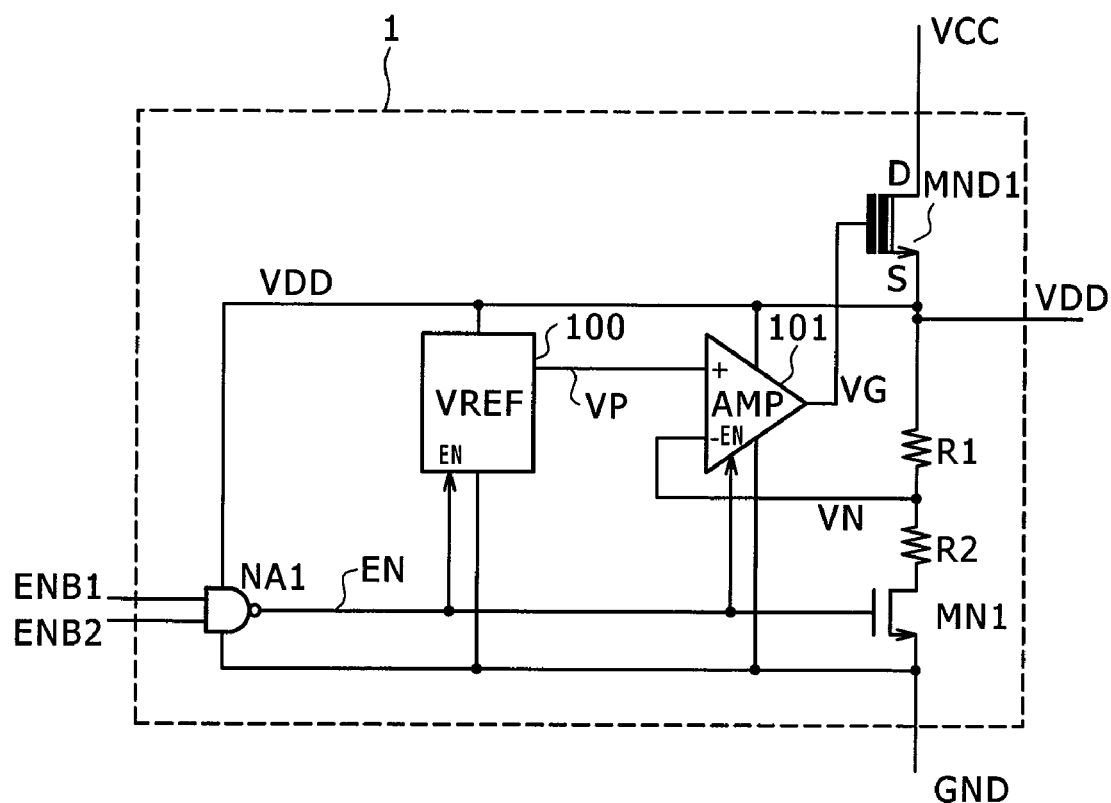
FIG. 2 is a diagram illustrating a circuit example of the internal power generating circuit 1 of FIG. 1.

FIG. 2 is a diagram illustrating a circuit example of the internal power generating circuit 1. A first power supply terminal VCC is connected to a drain terminal D at a depression of an NMOS transistor MND1. If the external power VB is applied, even though an initial value of a gate terminal VG has a ground level, a potential of a source terminal S of the depression NMOS transistor MND1 rises according to a threshold value thereof. The source terminal S is connected to an output terminal of the internal power VDD and supplies power to a control amplifier 101 and a reference voltage circuit 100 controlling an output voltage thereof. The reference voltage circuit 100 and the control amplifier 101 receive the internal power VDD having been increased at the application of the external power VB to begin output a reference voltage VP. The control amplifier 101 receives the reference voltage VP and performs feedback control on a voltage VN of a contact point between resistors R1 and R2 for monitoring the internal power VDD so as to control the potential of the source terminal S at the depression of the NMOS transistor MND1 to a predetermined value.

Here, a control signal EN for controlling a turn on or off of the internal power generating circuit 1 is an output of a NAND gate having input terminals connected to the control terminal ENB1 and the control terminal ENB2, and the reset signal RST outputting the low level during the predetermined period when the internal power VDD rises, is input to the control terminal ENB2. Accordingly, even though the control signal D1 input to the control terminal ENB1 has an indefinite value, it is possible to make the control signal EN have a high level so as to operate the circuit. Therefore, even when the external power VB is applied, a normal operation is possible.

Figure 3:
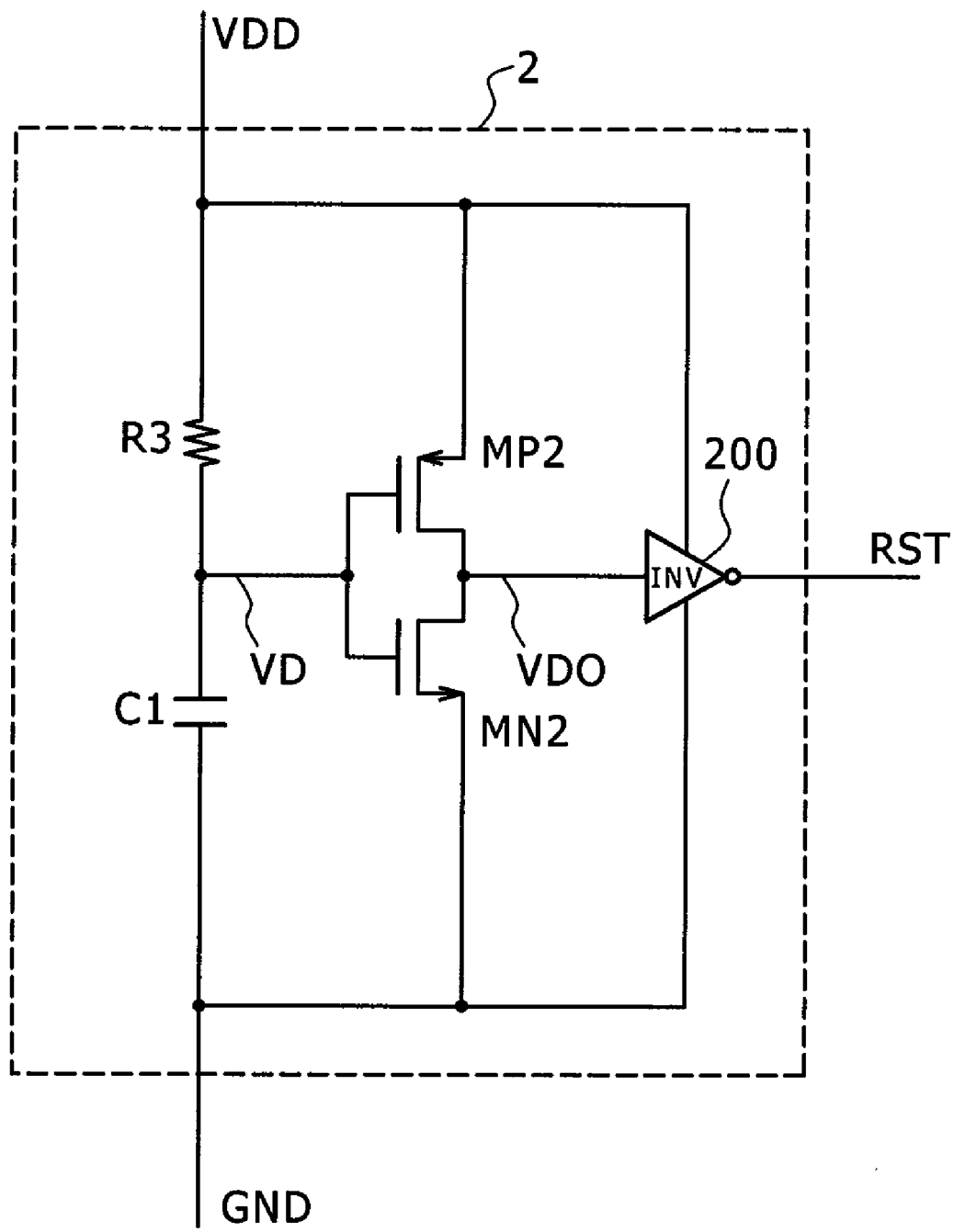
FIG. 3 is a diagram illustrating a circuit example of the POR circuit 2 of FIG. 1.

FIG. 3 is a diagram illustrating an example of the POR circuit 2. One end of a resistor 3 is connected to an internal power supply terminal VDD and one end of a capacitor C1 is connected to an internal ground terminal GND. The other end of the resistor 3 and the other end of the capacitor C1 are connected to an internal potential point VD so as to form a RC filter. When internal power VDD rises from an initial value ground level to a predetermined value, a signal VD of the internal potential point VD follows the internal power VDD later by a time constant, which is determined by the values of the resistor R3 and the capacitor C1. Therefore, an output VDO of an inverter composed of MOS transistors MP2 and MN2 has a high level during a predetermined period until the signal VD exceeds a logic threshold value of the inverter with respect to the internal power VDD. As a result, the output signal RST (the reset signal RST) of a buffer 200 receiving the output VDO maintains a low level during a predetermined period and then outputs a high level. The time constant of the RC filter is arbitrarily set on the basis of a rising response of the internal power VDD generated by the internal power generating circuit 1.

Figure 4:
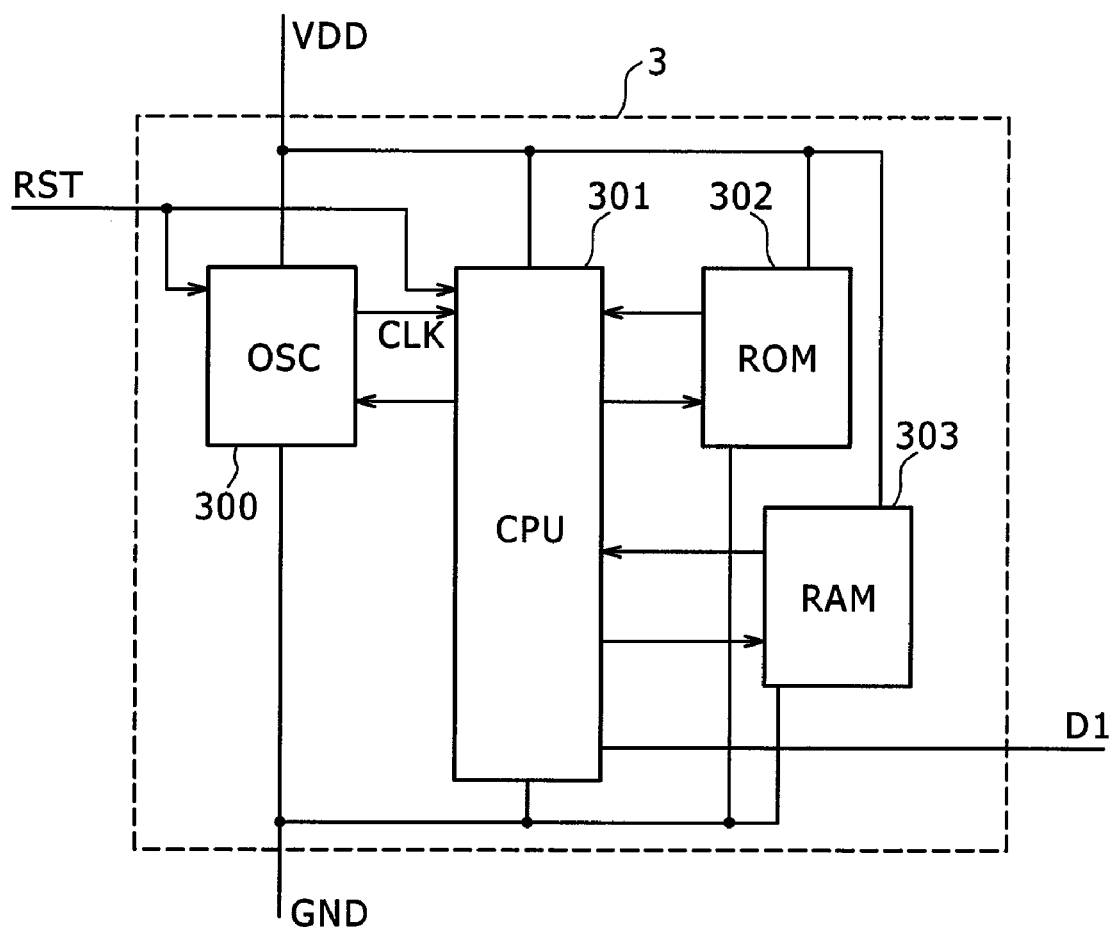
FIG. 4 is a diagram illustrating a circuit example of the control circuit 3 of FIG. 1.

FIG. 4 is a diagram illustrating a circuit example of the control circuit 3. A built-in oscillator 300 supplies a reference clock CLK to a processor 301. The processor 301 performs data communication with a built-in ROM 302 or a built-in RAM 303. Further, the control signal D1 or the like is output. The reset signal RST input from the POR circuit 2 may be input to the built-in oscillator 300 to stop the output of the reference clock until the oscillation is stable or the reset signal RST may be input to the processor 301 to be used to reset a register or a timer constituting the processor. Moreover, an enable signal is input from the processor 301 to the built-in oscillator 300. For example, when an IDDQ leak test is performed, it is required to stop the built-in oscillator 300. In this case, after the internal power VDD is fixed, the processor 301 disables the built-in oscillator 300 by the enable signal so as to stop the clock, and is transitioned to a sleep mode.

Figure 5:
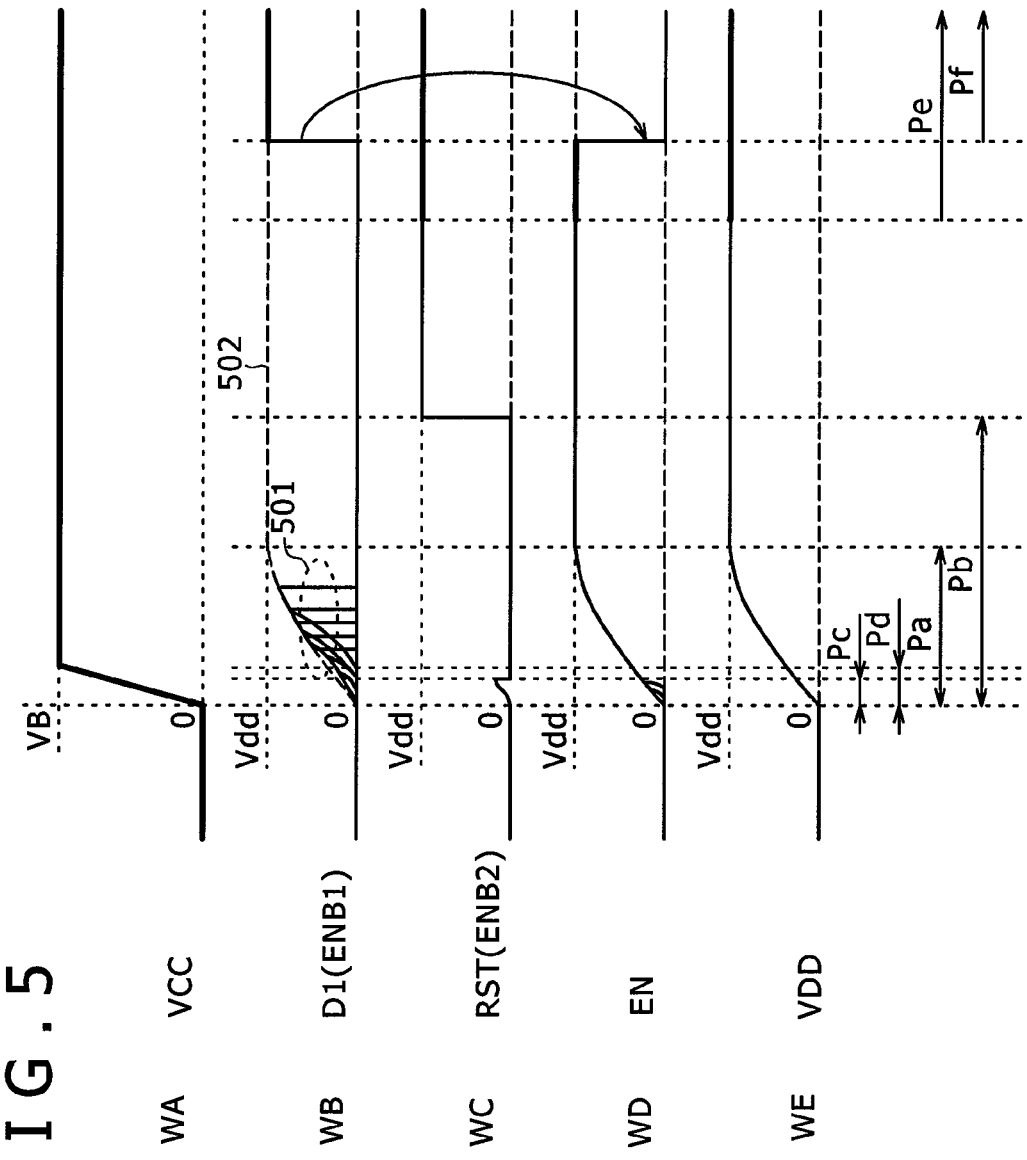
FIG. 5 is a waveform diagram illustrating an example of an operation of the semiconductor integrated circuit device of FIG. 1.

FIG. 5 is a waveform diagram illustrating an example of an operation when an IDDQ leak test is performed in the semiconductor integrated circuit of FIG. 1. A waveform WA illustrates the waveform of the external power VB applied between the first power supply terminal VCC and the second power supply terminal GND, waveforms WB illustrate the waveforms of the control signal D1, a waveform WC illustrates the waveform of the reset signal RST, waveforms WD illustrate the waveforms of the control signal EN of the internal power generating circuit 1, and a waveform WE illustrates the waveform of the internal power VDD. Moreover, a period Pa is a period in which there may be indefinite logic in the internal circuit at the rising of the internal power VDD, and a period Pb is a logic reset period (in which the reset signal RST is maintained at a low level) by the reset signal RST defined in the specification of the semiconductor integrated circuit. Further, a period Pc is a period in which the reset signal RST has an indefinite value at the rising of the internal power VDD, and a period Pd is a period in which the internal power VDD rises at the depression of the NMOS transistor MND1 in the internal power generating circuit 1. Furthermore, a period Pe is a period in which a voltage Vdd corresponding the internal power is applied from the external of the semiconductor integrated circuit device, and a period Pf is a period in which the control signal D1 has a high level and the control signal EN has a low level such that the internal power generating circuit 1 is in a turn-off state.

Figure 13:
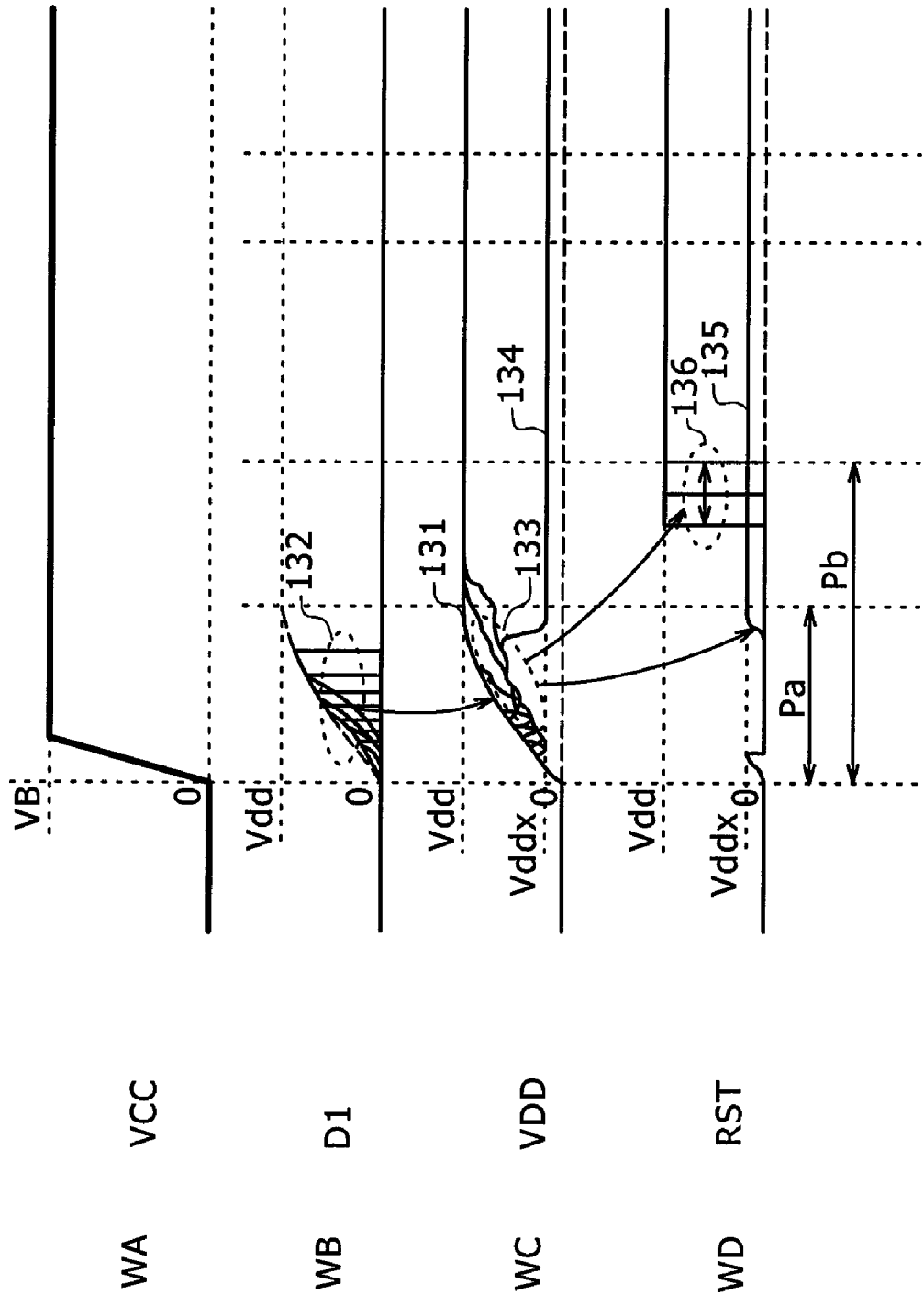
FIG. 13 is a waveform diagram illustrating an operation example of the semiconductor integrated circuit device of FIG. 12.

The external power VB is supplied between the first power supply terminal VCC and the second power supply terminal GND (the waveform WA). The internal power generating circuit 1 receives the external power VB, generates the internal power VDD (the waveform WE), and starts power supply to the POR circuit 2 which is an internal circuit or the control circuit 3. When the internal power VDD rises, a latch circuit such as a flip-flop, etc., constituting the control circuit 3, takes an indefinite value. Therefore, the POR circuit 2 generates the reset signal RST outputting the low level during a predetermined period (the period Pb), on the basis of a response of the internal power VDD, and the control circuit 3 is initialized by the reset signal RST. In the operation of the semiconductor integrated circuit device illustrated in FIG. 5, even though the control signal D1 temporarily becomes an indefinite state to have the high level (a waveform 501 of the waveforms WB) due to a reset signal delay or a reset signal propagation delay as described with reference to FIG. 13, the internal power generating circuit 1 can start a normal operation by receiving the reset signal RST maintaining the low level during the predetermined period (the period Pb).

In the period Pc, the reset signal RST has an indefinite value at the rising of the internal power VDD. This is because an indefinite value is easily generated when the internal power VDD is around a threshold voltage of the MOS transistors MP2 and MN2 constituting the inverter of FIG. 3. However, a device where an absolute value of a threshold voltage of the depression of the NMOS transistor MND1 of FIG. 2 constituting the internal power generating circuit 1 is larger than the absolute value of the threshold voltage of the MOS transistors MP2 and MN2 constituting the inverter of FIG. 3 is used, such that the indefinite value of the reset signal RST generated in the period Pc that automatically increases the internal power VDD is suppressed (the period Pd). Since the period Pc is a period in which the internal power VDD rises, an indefinite state may occur in the control signal D1 from the control circuit 3 (waveforms 501 of the waveforms WB, a waveform 502 is an expected waveform of the internal power VDD). However, in the period Pd determined on the basis of a response of the rising of the internal power VDD, since the POR circuit 2 makes the reset signal RST have a low level, the indefinite value of the control signal D1 is masked and the semiconductor integrated circuit device starts a normal operation.

Moreover, when an IDDQ leak test is performed after the semiconductor integrated circuit device starts an operation, the internal power VDD is fixed on the basis of the external power and then the control signal D1 from the control circuit 3 is transitioned from the low level to the high level. Since the reset signal RST has a high level after the period Pa, except when the operation starts, the control signal D1 is effective such that the control signal EN of the internal power generating circuit 1 is set to a low level, thereby turning off the internal power generating circuit 1.

Figure 6:
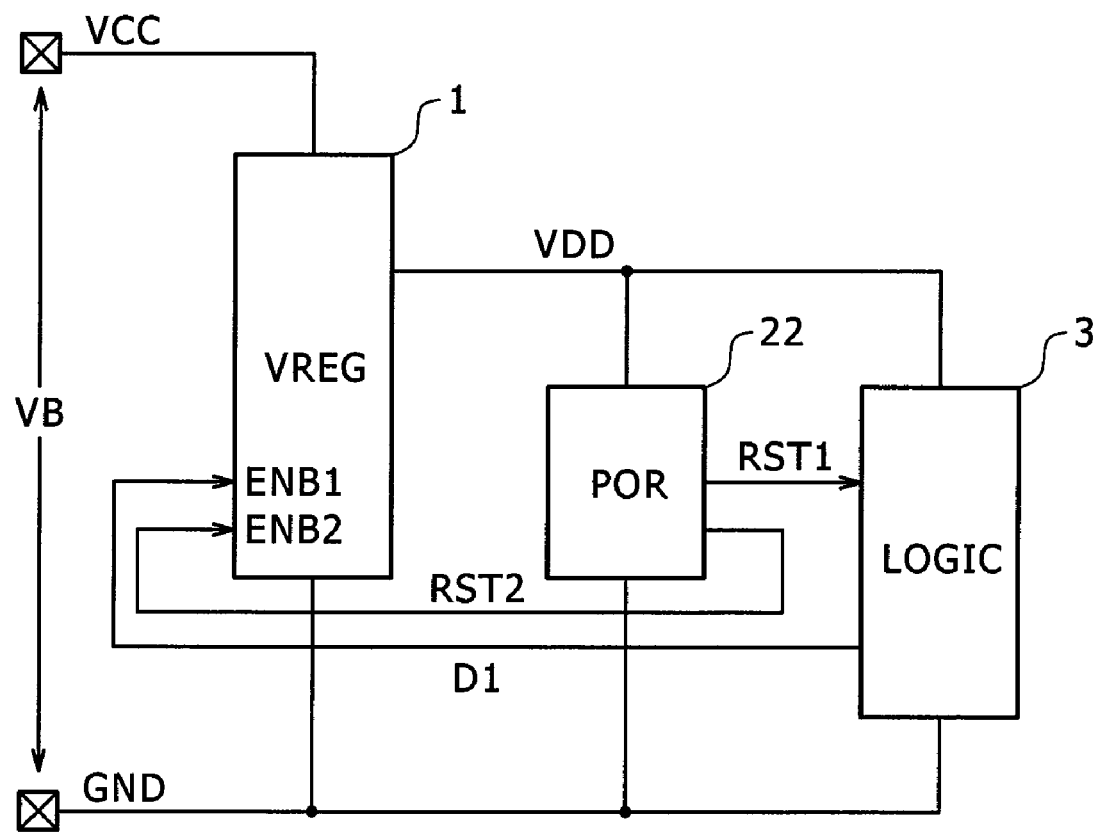
FIG. 6 is a diagram illustrating a modification example of the first embodiment of the present invention.

FIG. 6 is a diagram illustrating another configuration example of the semiconductor integrated circuit device. The basic operation of another configuration example shown in FIG. 6 is the same as that of the configuration example shown in FIG. 1. A POR circuit 22 outputs two reset signals RST1 and RST2 on the basis of a response of rising of an internal power VDD. A first reset signal RST1 is given as a reset signal for the control circuit 3. However, since the control circuit 3 may fix an output signal after the reset signal RST1 is received and a program or a timer performs a predetermined operation, depending on the configuration thereof, a second reset signal RST2 in response to a delay time is given as a starting signal for the internal power generating circuit 1. Therefore, even when the control signal D1 is fixed for a predetermined period since the reset signal RST1 is received, the internal power generating circuit 1 can start a normal operation when the external power VB is applied.

Figure 7:
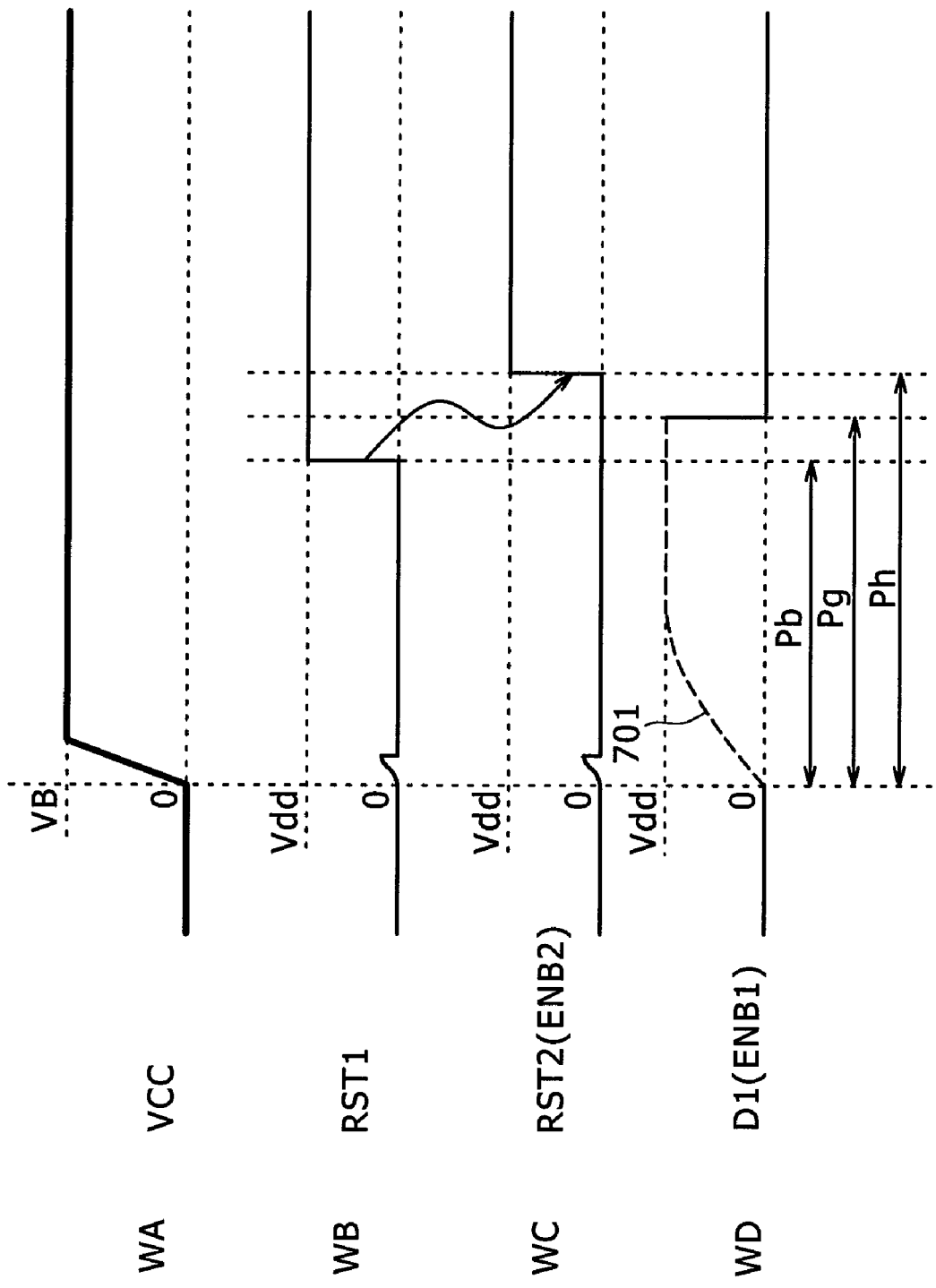
FIG. 7 is a waveform diagram illustrating an operation example of the semiconductor integrated circuit device of FIG. 6.

FIG. 7 is a diagram illustrating an example of an operation of the semiconductor integrated circuit device of FIG. 6. A waveform WA illustrates the waveform of the external power VB applied between the first power supply terminal VCC and the second power supply terminal GND, a waveform WB illustrates the waveform of the first reset signal RST1, a waveform WC illustrates the waveform of the second reset signal RST2, and a waveform D illustrates the waveform of the control signal D1. Moreover, a period Pb is a logic reset period (in which the reset signal RST1 is maintained at a low level) by the reset signal RST1 defined in the specification of the semiconductor integrated circuit, a period Pg is a period in which the control signal D1 may have an indefinite value, and a period Ph is a logic reset period (in which the reset signal RST2 is maintained at a low level) by the reset signal RST2. A waveform 701 of the waveform D is an expected waveform of the internal power VDD. The control signal D1 is a signal fixed after the internal power VDD is normalized and the program or the timer performs the predetermined operation, as described above. Therefore, in the period Pg, the control signal D1 has an indefinite value. However, in the period Ph, the indefinite value of the control signal D1 is masked by the second reset signal RST2, which suppress an indefinite value from being input to the internal power generating circuit 1. After the period Ph, the second reset signal RST2 is transitioned to the high level and the internal power generating circuit 1 is controlled by the control signal D1.

Figure 8:
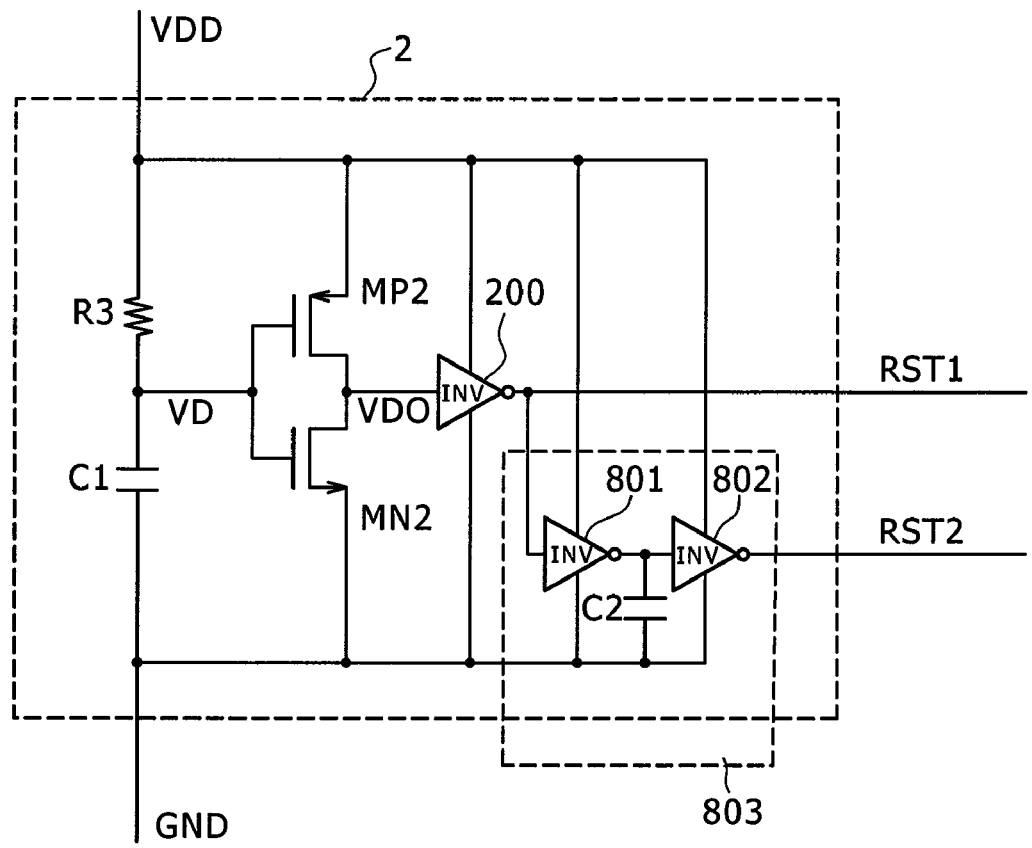
FIG. 8 is a diagram illustrating a circuit example of the POR circuit 22 of FIG. 6.

FIG. 8 is a diagram of a circuit example of the POR circuit 22 shown in FIG. 6. The first reset signal RST1 is generated similar to the reset signal RST shown in FIG. 3. Moreover, the first reset signal RST1 is delayed by an inverter 801 and a capacitor C2, is buffered in an inverter 802, and is output as the second reset signal RST2.

In the circuit example of FIG. 6, the POR circuit 22 outputs two reset signals. However, the POR circuit 22 may output a reset signal and have a delay circuit for delaying the reset signal by a predetermined time. When there are plural control signals which should be suppressed from having indefinite values such as the control signal D1, and accordingly, it is required to give different reset signals thereto, delay circuits having predetermined delay times adds the predetermined delay times to a reset signal, thereby making it possible to obtain desired reset signals. Therefore, the number of wiring lines from the POR circuit can be reduced. As the delay circuits, the delay circuit 803 of FIG. 8 can be used.

In a semiconductor integrated circuit device, plural internal power generating circuits receiving external power VB may be provided and control circuits operating on internal power generated by the individual internal power generating circuits may be provided. In this case, a POR circuit as shown in FIG. 1 or FIG. 6 may be provided for each of the internal power generating circuits. In other words, in one chip, plural semiconductor integrated circuits of FIG. 1 or FIG. 6 receiving external power VB from the first power supply terminal VCC and the second power supply terminal GND may be provided. When a control circuit receiving internal power supplied from one internal power generating circuit controls the internal power generating circuit which is a supply source, if a reset signal, which is generated on the basis of internal power received by the control circuit generating the control signal to be suppressed, not the reset signal generated on the basis of a rising response of the other internal power, is used to suppress a control signal from having an indefinite value, the same effects as those of the circuit of FIG. 1 or FIG. 6 can be obtained.

Figure 9:
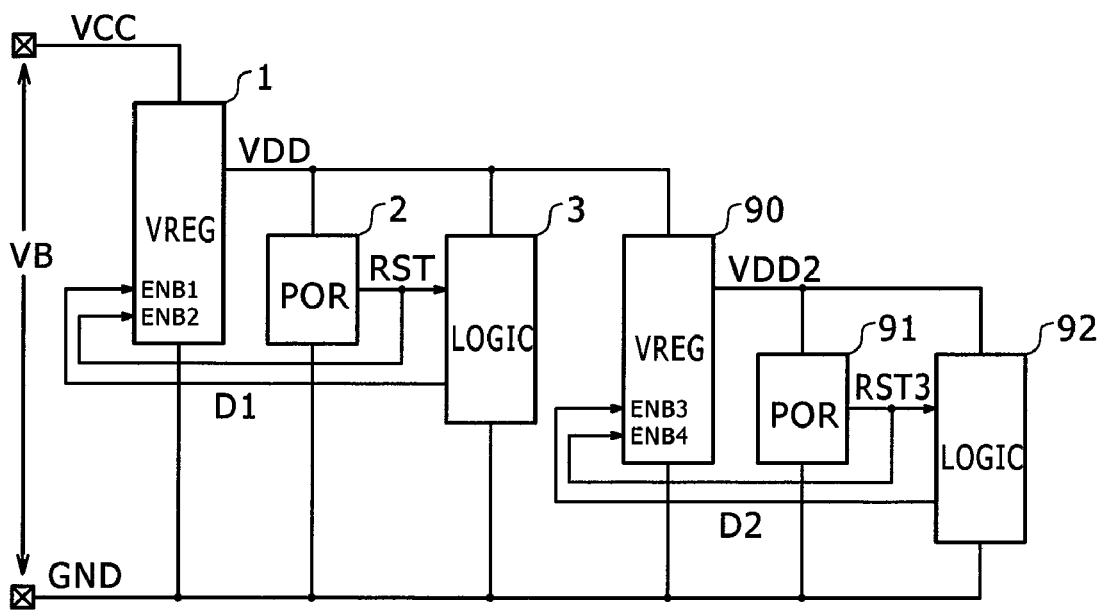
FIG. 9 is a diagram illustrating an example of a configuration of a semiconductor integrated circuit having plural internal power generating circuits.

FIG. 9 is a diagram illustrating another example of plural internal power generating circuits. Not external power but internal power VDD generated by a first internal power generating circuit 1 is supplied to a second internal power generating circuit 90. Internal power VDD2 generated by the second internal power generating circuit 90 is supplied to a POR circuit 91 and a control circuit 92. A reset signal RST3 generated by the POR circuit 91 and a control signal D2 output from the control circuit 92 are input to a control terminal ENB3 and a control terminal ENB4 of the second internal power generating circuit 90, respectively. As described above, the reset signal, which the POR circuit 91 generates, may be configured to be delayed and input to the internal power generating circuit.

Figure 10:
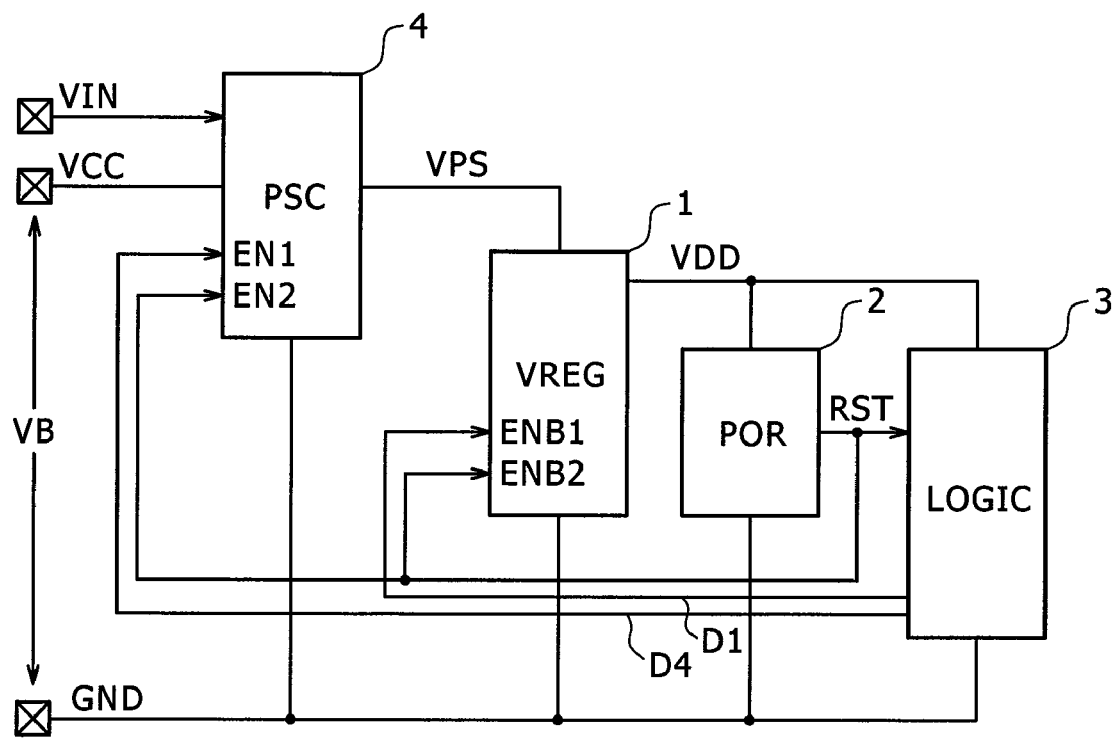
FIG. 10 is a diagram illustrating an example of a configuration of a semiconductor integrated circuit having a power control circuit.

FIG. 10 is a diagram illustrating an example in which a power control circuit 4 is provided between the first power supply terminal VCC and the internal power generating circuit 1. The power control circuit 4 is controlled by an external input signal VIN, and a control signal D4 and a reset signal RST input from a control circuit 3.

Figure 11:
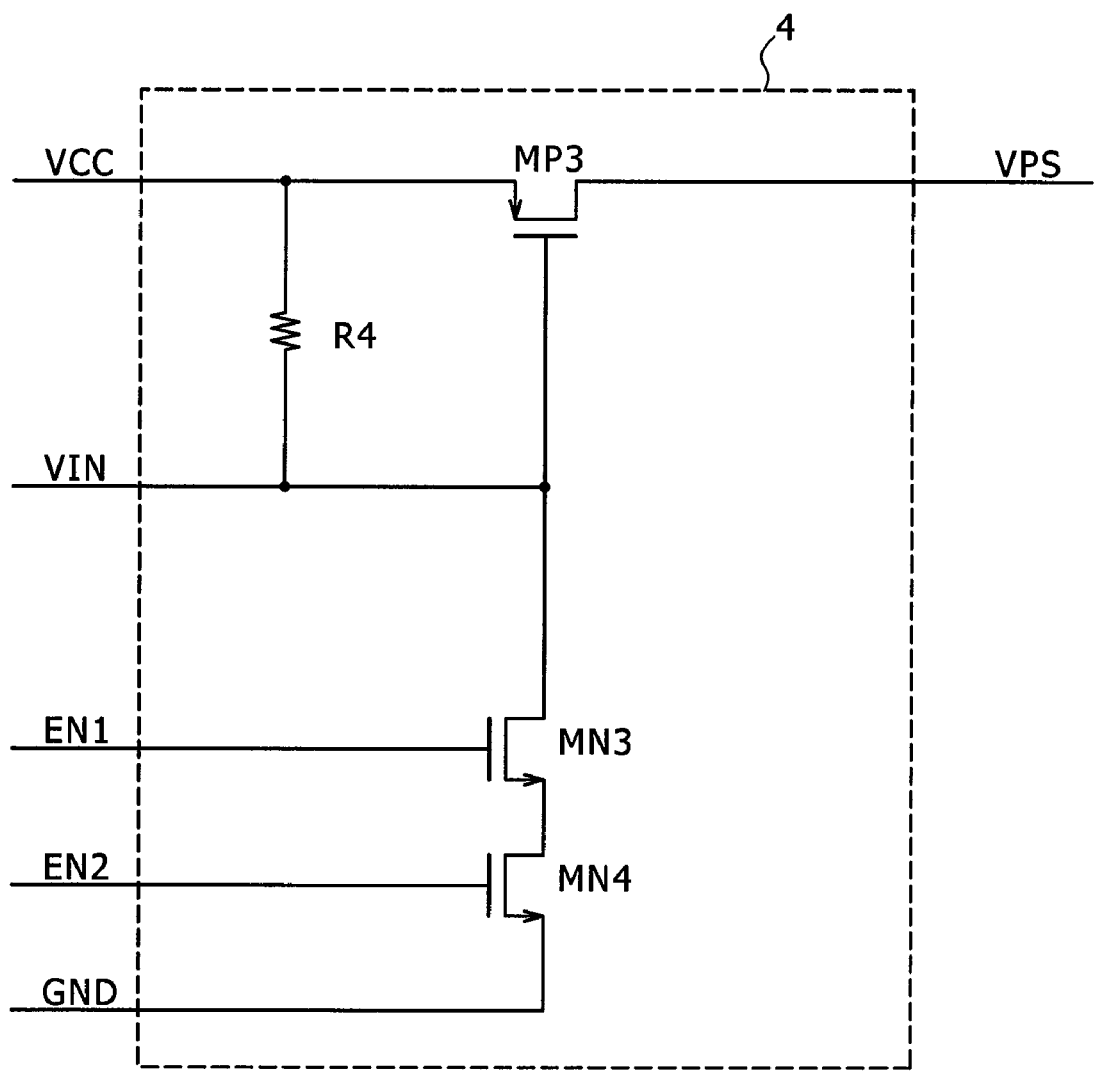
FIG. 11 is a diagram illustrating a circuit example of the power control circuit 4 of FIG. 10.
Figure 12:
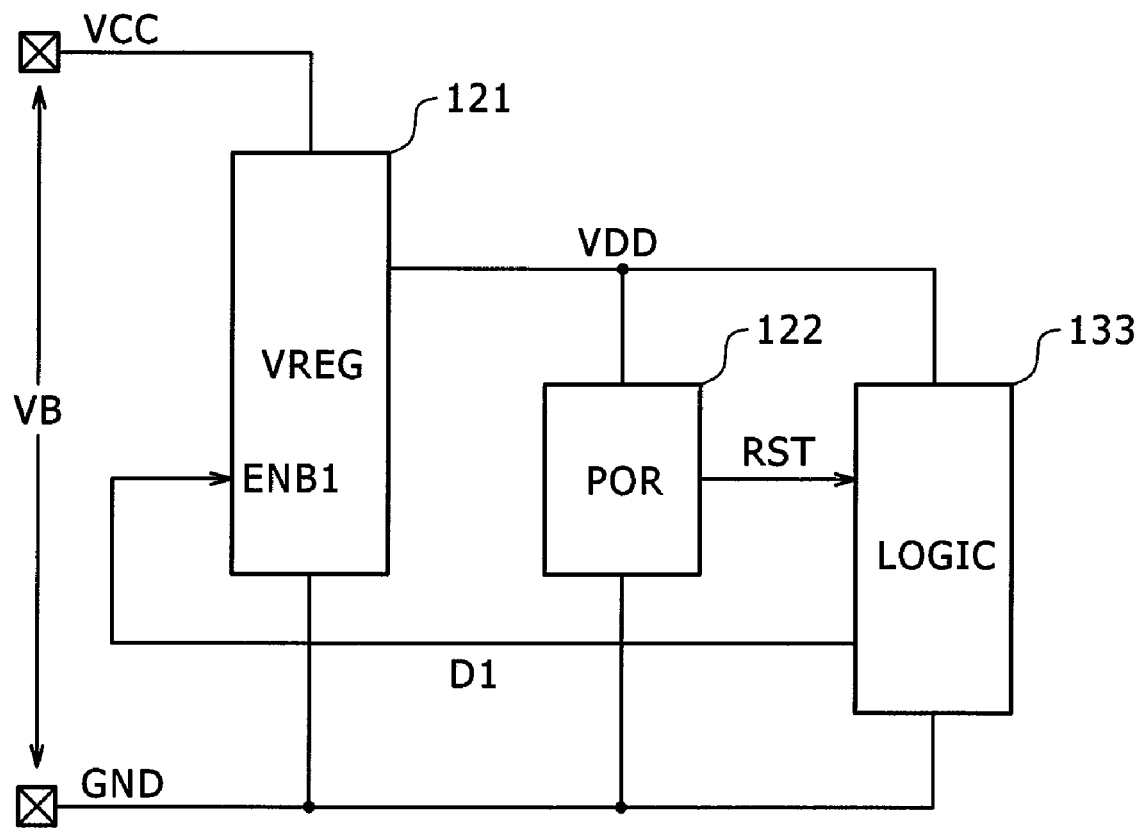
FIG. 12 illustrates a semiconductor integrated circuit device including an internal power generating circuit.

FIG. 11 is a diagram illustrating a circuit example of the power control circuit 4 shown in FIG. 10. The power control circuit 4 includes a MOS transistor MP3 serving as a power short-circuiting switch and a gate terminal of the MOS transistor MP3 is connected to a source terminal thereof through a pull-up resistor R4. According to a basic function of the power control circuit 4, when an starting signal having a GND level is input to an external input terminal VIN, a potential of the source terminal of the MOS transistor MP3 becomes higher than a potential of the gate terminal by the pull-up resistor R4 such that the MOS transistor MP3 is turned on and thus the first power supply terminal VCC and an output terminal VPS are short-circuited. Therefore, an external voltage is supplied to a power supply line of the internal power generating circuit 1 as an output of the output terminal VPS.

Here, the gate terminal of the MOS transistor MP3 is connected to the second power supply terminal GND through a MOS transistor MN3 and a Mbs transistor MN4. A gate terminal of the MOS transistor MN3 is connected to a control terminal EN1 receiving the control signal D3 from the control circuit 3, and a gate terminal of the MOS transistor MN4 is connected to a control terminal EN2 receiving the reset signal RST from the POR circuit 2.

If a starting signal having a GND level is input to the external input terminal VIN, the MOS transistor MP3, serving as a power short-circuiting switch of the power control circuit 4 is turned on such that the external power VB is supplied to the output terminal VPS. The internal power generating circuit 1 receives external power and is activated to supply the internal power VDD to the POR circuit 2 and the control circuit 3. The reset signal RST from the POR circuit 2 is transitioned from the low level to the high level, and the resetting of the control circuit 3 is cleared such that the control signal D3 having the high level to turn on the power control circuit 4 is given. Therefore, both of the control terminals EN1 and EN2 of the power control circuit 4 have the high level and thus the power control circuit 4 is in an ON state regardless of an input to the external input terminal VIN, whereby the semiconductor integrated circuit device can maintain an operation state.

Meanwhile, even when a noise signal having a ground level is input to the external input terminal VIN for a short time, temporarily, the MOS transistor MP3, serving as a power short-circuiting switch, of the power control circuit 4 is turned on such that the external power is supplied to the output terminal VPS and thus the internal power generating circuit 1 is activated. However, since the external input terminal VIN has the GND level for a short time, the MOS transistor MP3, serving as a power short-circuiting switch, is turned off at rising of the internal power VDD or before the reset signal RST is inverted and accordingly, resetting is cleared. Therefore, the external voltage supply from the first power supply terminal VCC is interrupted such that the semiconductor integrated circuit device falls into a stop state. Even in this case, in order to suppress an indefinite state from occurring in the control signal D3 at the rising of the internal power VDD, the reset signal RST is input to the control terminal EN2 of the power control circuit 4 and a masking process is performed to prevent the control signal D3 from functioning during the resetting period. Therefore, the semiconductor integrated circuit maintains the operation state only when the period, in which the starting signal input to the external input terminal VIN maintains the GND level, continues longer than the resetting period. As a result, a malfunction due to the noise signal to the external input terminal VIN can be prevented.

Moreover, the minimum of the period, in which the starting signal required to activate the semiconductor integrated circuit device by the external input terminal VIN maintains the GND level, is set to a resetting period by the reset signal RST. However, as described with reference to FIG. 6, the delayed reset signal may be used to extend the masked signal of the control signal D3 and to adjust the minimum of the period in which the starting signal input to the external input terminal VIN maintains the GND level.

What is claimed is:
1. A semiconductor integrated circuit device, comprising:
an internal power generating circuit receiving external power;
a control circuit receiving internal power from the internal power generating circuit and supplying a first control signal for controlling the internal power generating circuit; and
a power-on reset circuit receiving internal power and generating a first reset signal when the internal power rises which is input to the internal power generating circuit,
wherein, in a case where the internal power rises, the first reset signal masks an indefinite state of the first control signal supplied from the control circuit.

2. The semiconductor integrated circuit device according to claim 1, wherein the power-on reset circuit includes an inverter which has, as an input, a first potential point having a potential which rises following the rising of the internal power.

3. The semiconductor integrated circuit device according to claim 2, wherein the first potential point of the power-on reset circuit is an output of an RC filter, and
wherein a time constant of the RC filter is set on the basis of a rising response of the internal power.

4. The semiconductor integrated circuit device according to claim 1, wherein the internal power generating circuit has a first conductive type of depression MOS transistor and the first conductive type of first MOS transistor has a source/drain path between a first external terminal and a second external terminal providing external power and connected in series with each other,
wherein the depression of the MOS transistor is controlled by a control amplifier receiving the internal power,
wherein the first MOS transistor is controlled by the first control signal from the control circuit, and
wherein, in case that the internal power rises, the first reset signal prevents the control signal having an indefinite state from being transmitted to a gate of the first MOS transistor.

5. The semiconductor integrated circuit device according to claim 4, wherein the internal power generating circuit has a reference voltage circuit receiving the internal power and generating a reference voltage of the control amplifier,
wherein the reference voltage circuit and the control amplifier are controlled by a first control signal from the control circuit, and
wherein, in case that the internal power rises, the first reset signal prevents the first control signal having an indefinite state from being transmitted to the reference voltage circuit and the control amplifier.

6. The semiconductor integrated circuit device according to claim 1, further comprising:
a second internal power generating circuit generating a second internal power receiving the internal power generated by the internal power generating circuit;
a second control circuit receiving second internal power supplied from the second internal power generating circuit, and supplying a second control signal for controlling the second internal power generating circuit; and
a second power-on reset circuit receiving the second internal power, and generating a second reset signal when the second internal power rises,
wherein, in a case where the second internal power rises, the second reset signal masks an indefinite state of the second control signal supplied from the second control circuit.

* * * * *